United States Patent [19]

Aihara et al.

[11] Patent Number: 4,517,527
[45] Date of Patent: May 14, 1985

[54] WAVEGUIDE AMPLIFIER CIRCUIT

[75] Inventors: Shigenobu Aihara; Akio Yamada, both of Tokyo, Japan

[73] Assignee: NEC Corporation, Tokyo, Japan

[21] Appl. No.: 484,162

[22] Filed: Apr. 12, 1983

[30] Foreign Application Priority Data

Apr. 15, 1982 [JP] Japan ................... 57-62866

[51] Int. Cl.³ ............................................. H03F 3/60
[52] U.S. Cl. ...................................... 330/287; 330/56
[58] Field of Search ............... 330/287, 56, 280, 53, 330/57

[56] References Cited

FOREIGN PATENT DOCUMENTS 1102224  3/1981  Fed. Rep. of Germany ........ 330/56

OTHER PUBLICATIONS

Michel Dydyk, "Efficient Power Combining" IEEE, MTT-S, 1970, International Microwave Symposium Digest, pp. 309-310.

Primary Examiner—James B. Mullins
Assistant Examiner—G. Wan
Attorney, Agent, or Firm—Charles E. Pfund

[57] ABSTRACT

A waveguide amplifier circuit has two semiconductor amplifier elements in a first waveguide circuit, a second waveguide circuit which is perpendicular to the first waveguide circuit and a termination circuit arranged at an end, remote from the semiconductor amplifier elements, of the second waveguide circuit. An abnormal oscillation component between the two semiconductor amplifier elements is attenuated by the second waveguide circuit and the termination circuit, thereby obtaining a high power output.

4 Claims, 8 Drawing Figures

WAVEGUIDE AMPLIFIER CIRCUIT

BACKGROUND OF THE INVENTION

1. Field of the Invention

The present invention relates to a waveguide amplifier circuit which has a waveguide circuit and solid state amplifier elements therein which are subjected to simultaneous or parallel operation.

2. Description of the Prior Art

Conventionally, a high power amplifier for a very high frequency bandwidth comprises semiconductor amplifier elements in favor of long service life. However, since the semiconductor amplifier elements generate heat during operation, resulting in a temperature rise in the elements, they will not be allowed to consume power beyond a predetermined amount. Power outputs of the elements are thus limited. For this reason, a circuit is required which synthesizes very high frequency power outputs of these semiconductor amplifier elements.

From Michel Dydyk, "Efficient Power Combining" IEEE, MTT-S, 1970, International Microwave Symposium Digest, pp 309-310, for example, the following power synthesis methods are known; a method in which reflex amplifier circuits are connected in series with each other such that their gain is controlled in accordance with output power of the semiconductor amplifier elements power; another method in which a waveguide amplifier circuit is connected in parallel with a hybrid circuit. However, when these methods are applied to waveguide circuits, the circuit arrangement become complicated. Meanwhile, when a waveguide circuit is arranged using a coaxial circuit such as a microwave strip, a circuit loss greatly increases.

In order to simplify the arrangement of the waveguide amplifier circuit, a reflex amplifier circuit can be conceivable wherein at least two semiconductor elements are arranged in a single waveguide.

FIG. 1a is a partially sectional plan view of an example of a conventional reflex amplifier circuit, while FIG. 1b is a side view thereof. Referring to FIGS. 1a and 1b, semiconductor elements 11 and 12 are arranged on a plane perpendicular to an electromagnetic wave propagation or travelling direction as shown by an arrow A, substantially making symmetry to a center line 30 of a waveguide 1. A portion 2 indicated by a curved arrow denotes a circulator. Reference numeral 21 denotes a coupling post. The amplifier circuit having the above arrangement is, however, liable to unstable operation at a frequency at which the electrical distance between the semiconductor elements 11 and 12 is half the wavelength of the electromagnetic wave propagating in the arrow B direction. It is therefore very difficult to arrange an unoscillatory power amplifier circuit which can produce a desired synthesized power stably. This is because electromagnetic coupling between two semiconductor elements is very close and the intensity of the electric field is zero at a middle point between the elements 11 and 12. Such nonuniform distribution of the electric field disables coupling to an external circuit. Furthermore, once this mode occurs, it cannot be easily attenuated, thereby resulting in abnormal oscillation.

SUMMARY OF THE INVENTION

The present invention has been made in consideration of the conventional drawbacks, and has for its object to provide a simple and stably operable waveguide amplifier circuit which allows parallel operation of semiconductor elements.

In order to achieve the above object of the present invention, there is provided a waveguide amplifier circuit comprising a waveguide circuit having two semiconductor amplifier elements of substantially the same electrical characteristics which are arranged on substantially the same plane perpendicular to an electromagnetic wave propagation direction; an additional waveguide circuit arranged substantially at the center between the semiconductor amplifier elements and extending in a direction which is perpendicular to a direction along a line connecting the semiconductor amplifier elements and to the electromagnetic wave propagation direction; and a termination circuit arranged at an end, remote from the semiconductor amplifier elements, of the additional waveguide circuit.

BRIEF DESCRIPTION OF THE DRAWINGS

FIG. 1b is a side view of the waveguide amplifier circuit shown in FIG. 1a;

FIG. 2b is a front view of the reflex waveguide amplifier circuit shown in FIG. 2a;

FIG. 2c is a side view of the reflex waveguide amplifier circuit shown in FIG. 2a;

DETAILED DESCRIPTION OF THE PREFERRED EMBODIMENT

Figure 1A:
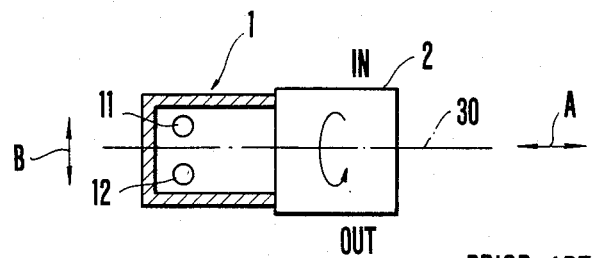
FIG. 1a is a partially sectional plan view of a conventional waveguide amplifier circuit for parallel-operating semiconductor amplifier elements therein.
Figure 1B:
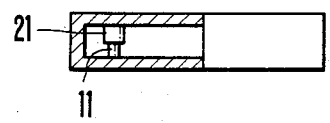
Figure 2A:
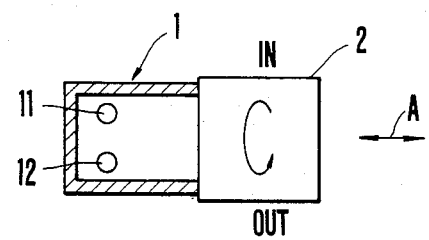
FIG. 2a is a partially sectional plan view of a reflex waveguide amplifier circuit according to an embodiment of the present invention.
Figures 2B, 2C:
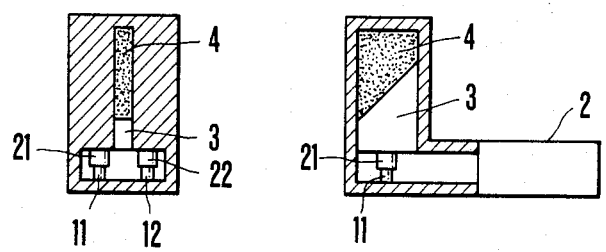
Figure 3:
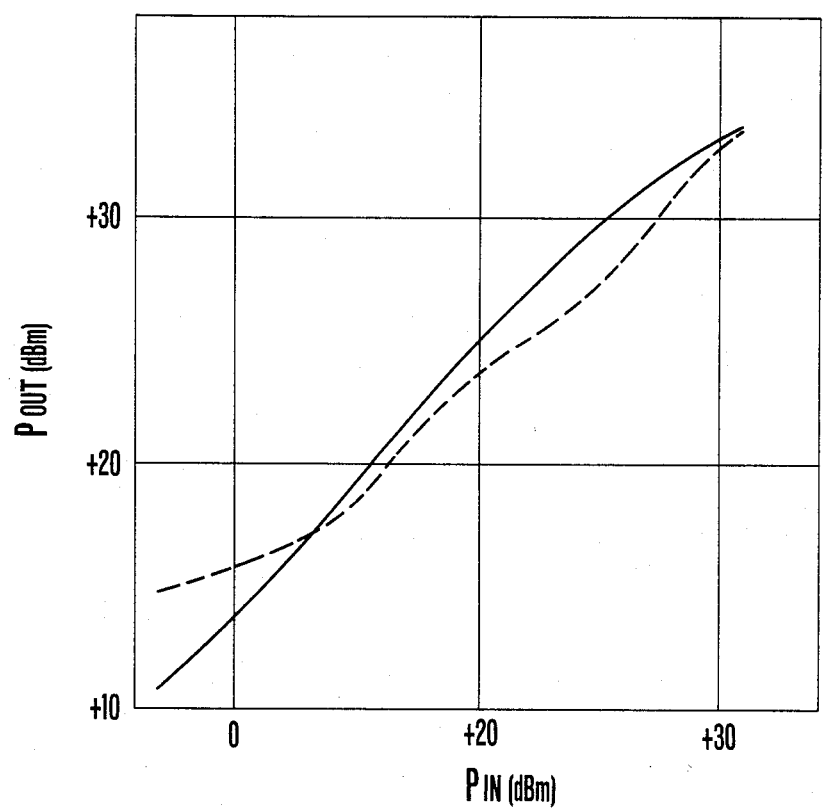
FIG. 3 is a graph obtained by plotting output power Pout as a function of input power Pin so as to explain linearity of the input-output characteristics.

Referring to FIGS. 2a, 2b and 2c, a reflex waveguide amplifier circuit according to an embodiment of the present invention comprises semiconductor amplifier elements in the form of IMPATT diodes (negative resistance elements to be described later with reference to FIGS. 4 and 5) 11 and 12, a waveguide circuit 3 which is additional to a first waveguide circuit comprised of a circulator 2, and a termination circuit 4 at an end, remote from the diodes, of the waveguide circuit 3. The IMPATT diodes have substantially the same electrical characteristics and are arranged on substantially the same plane perpendicular to an electromagnetic wave propagation direction as shown by an arrow A in FIG. 2a. The outer wall made of metal of the first, box-like waveguide circuit rises upwards to one end to form a closure in which an elongated cavity for the waveguide circuit 3 is formed. Thus, the additional waveguide circuit 3 is arranged substantially at the center of the IMPATT diodes 11 and 12 and extends in a direction which is perpendicular to a direction along a line connecting the IMPATT diodes 11 and 12 and to the electromagnetic wave propagation direction. The termination circuit 4 made of resistance element is provided at the top end portion of the cavity. An end surface of the termination circuit 4 exposed to the cavity is inclined to effectively absorb electromagnetic waves. The reflectionless termination circuit 4 corresponds to a terminal of a magic tee to be described in detail later with reference to FIGS. 4 and 5. The reflex wave amplifier circuit of the present invention has the above arrangement so that the unwanted oscillation mode occurring in the conventional circuit shown in FIGS. 1a and 1b can be effectively attenuated by the waveguide circuit 3 and the termination circuit 4. When a desired signal wave which can be coupled to an input/output circuit is occurring, the waveguide circuit 3 and the termination circuit 4 may not be substantially coupled to this signal wave since this signal has in-phase potential at the intermediate point between the semiconductor elements 11 and 12. The circuit shown in FIGS. 2a, 2b and 2c is less coupled to the external circuit and can effectively attenuate the excitation mode in which the waveguide is almost unloaded. Therefore, the abnormal oscillation due to the additive excitation of the IMPATT diodes 11 and 12 can be attenuated effectively and stable input-output characteristics with good linearity can be obtained as shown at a solid curve in FIG. 3. A dotted curve represents linearity obtained with the prior art amplifier, showing a flare portion indicative of surplus slight oscillation.

Figure 4:
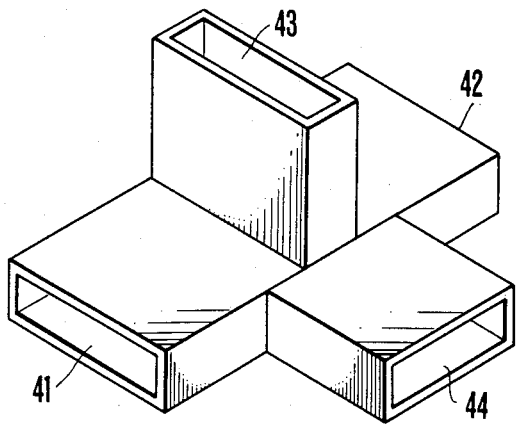
FIG. 4 is a schematic perspective view of a waveguide magic T(tee) so as to describe the effect of the reflex waveguide amplifier circuit according to the embodiment of the present invention.
Figure 5:
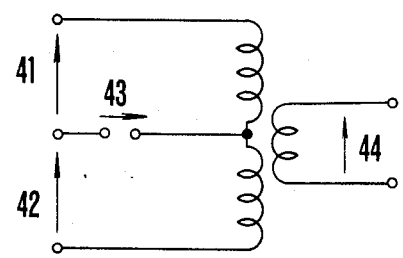
FIG. 5 is a circuit diagram of an equivalent circuit of the waveguide magic T shown in FIG. 4.

FIG. 4 is a schematic perspective view of a waveguide magic tee, and FIG. 5 shows an equivalent circuit thereof. The conventional waveguide amplifier circuit may be very effectively compared with the reflex waveguide amplifier circuit of the present invention by reference to the magic tee, since the operation of the magic tee resembles that of the waveguide amplifier circuit. Referring to FIG. 5, an input signal received at a terminal 44 is equally distributed to terminals 41 and 42, and a power output does not appear at a terminal 43. When signals which have the same amplitude and phase are supplied to the terminals 41 and 42, respectively, a power output does not appear at the terminal 43 but appears at the terminal 44 alone.

However, when voltages which have opposite polarities are applied to the terminals 41 and 42, respectively, the voltage signals are cancelled at the terminal 44, and a signal appears at the terminal 43. In this case, when the terminal 43 is closed or short-circuited, the signal from the terminal 41 propagates toward the terminal 42 and vice versa, thus behaving as if all the terminals are short-circuited. In this condition, if a resistor element is connected to the terminal 43, all the signals supplied from the terminals 41 and 42 appear substantially at the terminal 43.

Assume that two-terminal resistor elements such as IMPATT diodes or Gunn diodes are respectively arranged at the terminals 41 and 42. The above assumption is equivalent to the fact that negative resistor elements are arranged at the terminals 41 and 42 of the magic tee with the terminal 43 being short-circuited. If the terminals 41 and 42 have a distance therebetween corresponding to an electrical distance of ½ wavelength or an integer multiple of ½ wavelength of a signal appearing therebetween, oscillation tends to occur. Furthermore, it is apparent that the oscillation signals supplied to the terminals 41 and 42 are cancelled at the terminal 44. The above-mentioned description can be applied to the conventional waveguide amplifier circuit with reference to FIGS. 1a and 1b.

However, according to the present invention, a portion corresponding to the terminal 43 of the magic tee is arranged as the termination circuit 4 (FIGS. 2a, 2b and 2c). The negative resistance elements (corresponding to IMPATT diodes 11 and 12 in FIGS. 2a, 2b and 2c) are arranged at the terminals 41 and 42 which are symmetrical to the terminal 44. The signals of the same phase from the negative resistance elements are apparently reflected and amplified, thus reproducing the power output at the terminal 44. In this case, the signal components which have the same phase do not appear at the terminal 43 at all. As a result, all the power amplified by the negative resistance elements (by the IMPATT diodes 11 and 12 in the circuit shown in FIGS. 2a, 2b and 2c) can be produced at the terminal 44.

In summary, the parallel operation of the semiconductor amplifier elements can be stably performed with low circuit loss, achieving a compact structure at low cost. In the case of arranging a high power amplifier by utilizing the waveguide circuit, an effective practical circuit can be realized.

The semiconductor amplifier elements used in the above embodiment may be replaced with a reflex amplifier circuit having the same performance as the semiconductor amplifier elements, thus obtaining the same effects and operation. The present invention can thus be applied to such a reflex amplifier circuit.

What is claimed is:

1. A waveguide reflection amplifier circuit comprising:
    a waveguide circuit reflecting and amplifying an input electromagnetic wave, and having two semiconductor amplifier elements of the same electrical characteristics which are arranged on the same plane perpendicular to a propagation direction of said input electromagnetic wave;
    an additional waveguide circuit arranged at the center between said semiconductor amplifier elements and extending in a direction which is perpendicular to a direction along a line connecting said semiconductor amplifier elements and to the electromagnetic wave propagation direction; and
    a termination circuit arranged at an end, remote from said semiconductor amplifier elements, of said additional waveguide circuit.

2. A circuit according to claim 1, wherein each of said two semiconductor amplifier elements comprises an IMPATT diode.

3. A circuit according to claim 2, wherein said two semiconductor amplifier elements comprise a reflex amplifier element.

4. A circuit according to claim 1, wherein each of said two semiconductor amplifier elements comprises a Gunn diode.

* * * * *